United States Patent
Wang et al.

(10) Patent No.: US 11,294,350 B2
(45) Date of Patent: Apr. 5, 2022

(54) RAPID SHUTDOWN DEVICE CAPABLE OF DRIVING TWO MOSFETS CONNECTED IN SERIES THROUGH SINGLE DRIVE SIGNAL

(71) Applicant: ZHEJIANG JMTHY PHOTOVOLTAIC TECHNOLOGY CO., LTD, Ningbo (CN)

(72) Inventors: Weihui Wang, Cixi (CN); Xiangchun Deng, Jiaxing (CN)

(73) Assignee: ZHEJIANG JMTHY PHOTOVOLTAIC TECHNOLOGY CO., LTD, Ningbo (CN)

( * ) Notice: Subject to any disclaimer, the term of this patent is extended or adjusted under 35 U.S.C. 154(b) by 101 days.

(21) Appl. No.: 16/882,806

(22) Filed: May 26, 2020

(65) Prior Publication Data

US 2021/0165390 A1   Jun. 3, 2021

(30) Foreign Application Priority Data

Dec. 3, 2019   (CN) .......................... 201922129833.9

(51) Int. Cl.
G05B 19/406 (2006.01)
H02S 40/34 (2014.01)
H03K 17/687 (2006.01)

(52) U.S. Cl.
CPC ............ *G05B 19/406* (2013.01); *H02S 40/34* (2014.12); *H03K 17/6871* (2013.01); *G05B 2219/50193* (2013.01)

(58) Field of Classification Search
CPC ........ G05B 19/406; G05B 2219/50193; H02S 40/34; H03K 17/6871; H03K 17/04123; H03K 17/7955; Y02E 10/50
USPC ........................................................ 307/326
See application file for complete search history.

(56) References Cited

FOREIGN PATENT DOCUMENTS

WO    WO-2020000862 A1 *  1/2020

* cited by examiner

*Primary Examiner* — Metasebia T Retebo
(74) *Attorney, Agent, or Firm* — McClure, Qualey & Rodack, LLP

(57) ABSTRACT

A rapid shutdown device capable of driving two MOSFETs connected in series through single drive signal, which includes a switch S1, a switch S2, a control IC and a drive circuit. The PV+ terminal of the photovoltaic module is connected to an output terminal OUT+ through the switch S1 and the switch S2 connected in series in sequence. The PV- terminal of the photovoltaic module is connected to an output terminal OUT-. The control IC, the switch S1 and the switch S2 are connected with the drive circuit respectively, and the two signal terminals of the control IC control the on-off of switch S1 and switch S2 through the drive circuit. The invention adopts two switches connected in series for on-off operation, greatly improving the shutoff reliability and safety of the photovoltaic power generation system.

5 Claims, 3 Drawing Sheets

RAPID SHUTDOWN DEVICE CAPABLE OF DRIVING TWO MOSFETS CONNECTED IN SERIES THROUGH SINGLE DRIVE SIGNAL

TECHNICAL FIELD

The invention belongs to the field of power electronics technology, in particular relates to a rapid shutdown device capable of driving two MOSFETs connected in series through single drive signal.

BACKGROUND ART

As a renewable and pollution-free energy, solar energy has attracted more and more attention. At the same time, with the progress of power electronic technology, photovoltaic grid-connected power generation technology has been able to develop rapidly. Photovoltaic power generation system has a number of PV modules connected in series to form PV module string, and then connects the PV module string to the inverter to realize conversion of DC to AC so as to realize grid-connected power generation. Considering that the photovoltaic modules connected in series will form a DC high voltage, which will lead to personal danger and fire accidents, the photovoltaic power generation system is required to achieve a rapid shutoff at the module level in case of emergency.

The requirement of rapid shutoff is mainly for the protection of fire personnel and photovoltaic power station installation and maintenance personnel. Generally, there will be 600V-1000V DC high voltage on the DC side in the photovoltaic power generation system as long as there is solar irradiation. In case of fire in the power station, firefighters cannot carry out fire fighting and rescue work until the whole power station is burned down.

For the above reasons, it is very important to realize the rapid shutoff of each module in the photovoltaic power station. Currently, the common practice is to connect the shutdown device outside each module. In case of emergency, this device can rapidly disrupt the connection between photovoltaic modules, thus eliminating the DC high voltage in the photovoltaic power generation system, reducing the risk of electric shock and avoiding the rescue risk. However, the existing shutdown device uses a single tube for shutoff. If the single tube fails, high voltage output will result, thus threatening the lives of firefighters. The control part of the existing shutdown device is the control IC. For the dedicated control IC, the shutoff signal receiving function is integrated internally, and there is only single-channel drive signal. If the single-channel signal is not processed, it will be difficult to enter a safe shutoff mode when the control IC fails. As shown in FIG. 1, when the single drive signal pin of the control IC is short-circuited with its adjacent pin, the gate drive of the MOSFET will be at constant high level and in on state if a constant high level state occurs, thus failing to realize safety shutoff.

CONTENTS OF THE INVENTION

In light of the defects in the prior art, the invention provides a rapid shutdown device capable of driving two MOSFETs connected in series through single drive signal, which uses two switches connected in series for on-off operation, greatly improving the shutoff reliability and safety of the photovoltaic power generation system, preventing high voltage output due to single tube failure when it is necessary to shut off, and avoiding personal safety risks.

The invention provides a rapid shutdown device capable of driving two MOSFETs connected in series through single drive signal, which comprises a switch S1, a switch S2, a control IC and a drive circuit;

The PV+ terminal of the photovoltaic module is connected to an output terminal OUT+ through the switch S1 and the switch S2 connected in series in sequence; the PV− terminal of the photovoltaic module is connected to an output terminal OUT−;

The control IC, the switch S1 and the switch S2 are connected with the drive circuit respectively, and the two signal terminals of the control IC control the on-off of switch S1 and switch S2 through the drive circuit.

A rapid shutdown device capable of driving two MOSFETs connected in series through single drive signal also comprises an input capacitor Cin, an output capacitor Cout, a bypass diode D1 and an output resistor Rx;

The input capacitor CM is connected to the photovoltaic module in parallel, one end of the output capacitor Cout is connected to the output terminal OUT+, and the other end is connected to the output terminal OUT−. The output capacitor Cout, the bypass diode D1 and the output resistor Rx are connected in parallel.

Preferably, the switch S1 is MOSFET S1, and the switch S2 is MOSFET S2;

The PV+ terminal of the photovoltaic module is connected to a drain electrode of the MOSFET S2, a source electrode of the MOSFET S2 is connected with a drain electrode of the MOSFET S1, and a source electrode of the MOSFET S1 is connected with an output terminal OUT+; a drive terminal Drv2 of the drive circuit is connected to a gate pole of the MOSFET S2, and a drive terminal Drv1 of the drive circuit is connected to a gate pole of the MOSFET S1;

A common terminal where the MOSFET S2 and the MOSFET S1 are connected is the reference terminal S2GND.

Preferably, the drive circuit comprises a first drive module and a second drive module;

The control IC, the first drive module and the second drive module are electrically connected in turn, a drive terminal Drv2 of the second drive module is connected to a gate pole of the MOSFET S2, and a drive terminal Drv1 of the second drive module is connected to a gate pole of the MOSFET S1.

Preferably, the first drive module comprises an optocoupler OP1, a voltage regulator tube D3, a resistor R0, a resistor R1 and a resistor R2;

A first signal terminal of the control IC is connected to an input pin 2 of the optocoupler OP1 through the resistor R2 on one hand, and connected to an output pin 4 of the optocoupler OP1 on the other hand. A second signal terminal of the control IC is connected to an input pin 1 of the optocoupler OP1 through the resistor R1 on one hand, grounded through the voltage regulator tube D3 on one hand, and connected to a power supply VCC through the resistor R0 on the other hand.

Preferably, the second drive module comprises a switch Q1, a switch Q2, a switch Q3, a switch Q4, a voltage regulator tube D4, a voltage regulator tube D2 and a plurality of resistors;

An output pin 3 of the optocoupler OP1 is connected to a base of the switch Q1 through the resistor R3 on the one hand, connected to a base of the switch Q2 through the resistor R4 on the one hand, and grounded through the resistor R5 on the other hand;

An emitter of the switch Q1 is grounded, and a collector of the switch Q1 is connected to the gate pole of the switch Q3 on one hand and connected to the power supply VCC through the resistor R6 on the other hand;

An emitter of the switch Q2 is grounded, and a collector of the switch Q2 is connected to the gate pole of the switch Q4 on one hand and connected to the power supply VCC through the resistor R7 on the other hand;

A source electrode of the switch Q3 is grounded, and a drain electrode of the switch Q3 is connected to the power supply VDD through the resistor R8 on one hand and connected to a drive terminal Drv1 through the resistor R10 on the other hand;

A source electrode of the switch Q4 is grounded, and a drain electrode of the switch Q4 is connected to the power supply VDD through the resistor R9 on one hand and connected to a drive terminal Drv2 through the resistor R11 on the other hand;

An anode of the voltage regulator tube D4 is connected to an output terminal OUT+, and a cathode of the voltage regulator tube D4 is connected to the drive terminal Drv1;

An anode of the voltage regulator tube D2 is connected to an reference terminal S2GND, and a cathode of the voltage regulator tube D2 is connected to the drive terminal Drv2.

Preferably, the second drive module comprises a switch Q1, a switch Q2, a switch Q3, a switch Q4, an optocoupler OP2, an optocoupler OP3, a diode D4, a diode D2 and a plurality of resistors;

An output pin 3 of the optocoupler OP1 is grounded through the resistor R5 on one hand, connected to an input pin 1 of the optocoupler OP2 through the resistor R4 on one hand and connected to an input pin 1 of the optocoupler OP3 through the resistor R7 on the other hand;

An input pin 2 of the optocoupler OP2 is grounded through the resistor R3, an output pin 4 of the optocoupler OP2 is connected to an output terminal OUT+, an output pin 3 of the optocoupler OP2 is connected to the power supply VDD through resistors R9 and R10 connected in series in turn, a common terminal for connecting the resistors R9 and R10 is connected to a base of the switch Q1, an emitter of the switch Q1 is connected to the power supply VDD, a collector of the switch Q1 is connected to a base of the switch Q3 through the resistor R13, the base of the switch Q3 is connected with a collector of the triode Q3 through the resistor R15 on one hand and connected with an emitter of the triode Q3 through the diode D4 on the other hand, the collector of the triode Q3 is connected to the output terminal OUT+, and an emitter of the triode Q3 is connected to the drive terminal Drv1;

An input pin 2 of the optocoupler OP3 is grounded through the resistor R6, an output pin 4 of the optocoupler OP3 is connected to the reference terminal S2GND, an output pin 3 of the optocoupler OP3 is connected with the power supply VDD through resistors R11 and R12 connected in series in turn, a common terminal for connecting the resistors R11 and R12 is connected to a base of the switch Q2, an emitter of the switch Q2 is connected to the power supply VDD, a collector of the switch Q2 is connected to a base of the switch Q4 through the resistor R14, the base of the switch Q4 is connected with a collector of the triode Q4 through the resistor R16 on one hand and connected with an emitter of the triode Q4 through the diode D2 on the other hand, the collector of the triode Q4 is connected to the reference terminal S2GND, and the emitter of the triode Q4 is connected with the drive terminal Drv2.

The technical proposal of the invention adopts two switches connected in series for on-off operation, greatly improving the shutoff reliability and safety of the photovoltaic power generation system, preventing high voltage output due to single tube failure when it is necessary to shut off, and avoiding personal safety risks.

DESCRIPTION OF DRAWINGS

In order to more clearly describe the specific embodiment of the invention or the technical proposal in the prior art, the drawings to be used in the description of embodiments or prior art are briefly described below. In all drawings, similar components or parts are generally identified by similar drawing marks. In the drawings, the components or parts are not necessarily drawn to the actual scale.

EMBODIMENTS

The embodiments for the technical proposal of the utility model will be described in detail in combination with the drawings below. It is obvious that the embodiments described are part of the invention and not all of the embodiments. Based on the embodiments in the invention, all other embodiments obtained by ordinary technicians in the field without creative labor are covered in the scope of protection of the invention.

It should be understood that the terms "comprise" and "contain" indicate the presence of described characteristics, entirety, steps, operation, elements and/or components, but do not exclude the presence or addition of one or more other characteristics, entirety, steps, operation, elements, components and/or their collection when used in the specification and the claims.

It should also be understood that the terms used in the specification of the invention are intended to solely describe specific embodiments and are not intended to limit the invention. As used in the specification of the invention and the claims, "one" and "the" are intended to include the plural form unless the context clearly indicates otherwise.

It should also be further understood that the term "and/or" used in the specification of the invention and the claims means any combination and all possible combinations of one or more of the items listed correlatively and includes such combination(s).

As used in the specification and the claims, the term if may be construed contextually as "when . . . " or "once" or "in response to determine" or "in response to detect". Similarly, the phrase "if determined" or "if detected [the described condition or event]" can be interpreted contextually as "once determined" or "in response to determine" or "once detect [the described condition or event]" or "in response to detect [the described condition or event]".

Embodiment 1

Figure 1:
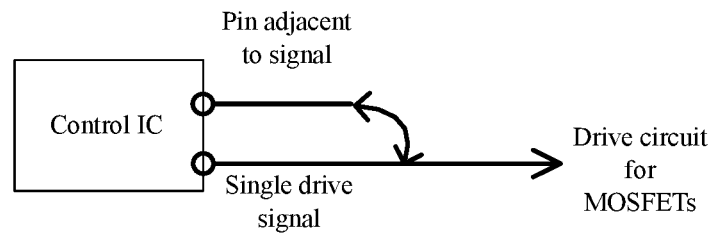
FIG. 1 is the schematic diagram for the adjacent pin short circuit of control IC for single-channel drive signal in the background art.
Figure 2:
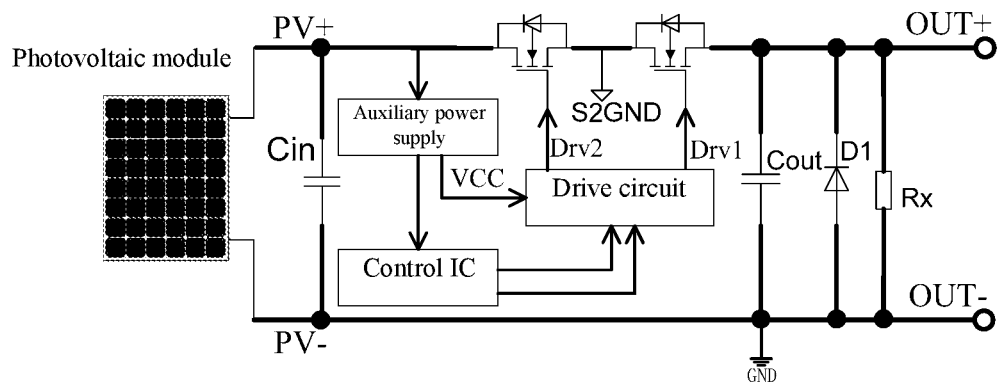
FIG. 2 is the circuit structure diagram for the rapid shutdown device capable of driving two MOSFETs connected in series through single drive signal.

The embodiment provides a rapid shutdown device capable of driving two MOSFETs connected in series through single drive signal, which comprise a switch S1, a switch S2, an input capacitor Cin, an output capacitor Cout, a bypass diode D1, an output resistor Rx, a control IC and a drive circuit as shown in FIG. 2;

The PV+ terminal of the photovoltaic module is connected to an output terminal OUT+ through the switch S1 and the switch S2 connected in series in sequence; the PV− terminal (namely, ground terminal) of the photovoltaic module is connected to an output terminal OUT−;

The input capacitor Cin is connected to the photovoltaic module in parallel, one end of the output capacitor Cout is connected to the output terminal OUT+, and the other end is connected to the output terminal OUT−. The output capacitor Cout, the bypass diode D1 and the output resistor Rx are connected in parallel.

The control IC, the switch S1 and the switch S2 are connected with the drive circuit respectively, and the two signal terminals of the control IC control the on-off of switch S1 and switch S2 through the drive circuit.

In the embodiment, the switch S1 is MOSFET S1, and the switch S2 is MOSFET S2; the PV+ terminal of the photovoltaic module is connected to a drain electrode of the MOSFET S2, a source electrode of the MOSFET S2 is connected with a drain electrode of the MOSFET S1, and a source electrode of the MOSFET S1 is connected with an output terminal OUT+; a drive terminal Drv2 of the drive circuit is connected to a gate pole of the MOSFET S2, and a drive terminal Drv1 of the drive circuit is connected to a gate pole of the MOSFET S1; a common terminal where the MOSFET S2 and the MOSFET S1 are connected is the reference terminal S2GND.

The rapid shutdown device of the embodiment is located between the photovoltaic module and the inverter, and uses MOSFETs connected in series for on-off operation, greatly improving the shutoff reliability and safety of the photovoltaic power generation system, preventing high voltage output due to single tube failure when it is necessary to shut off, and avoiding personal safety risks.

The rapid shutdown device of the embodiment also comprises an auxiliary power supply, an input of the auxiliary power supply is connected to PV+ of the photovoltaic module, and an output of the auxiliary power supply is connected to the control IC and the drive circuit to provide the working voltage for the control IC and the drive circuit.

The drive circuit of the embodiment has two structures, as described below.

Figure 3:
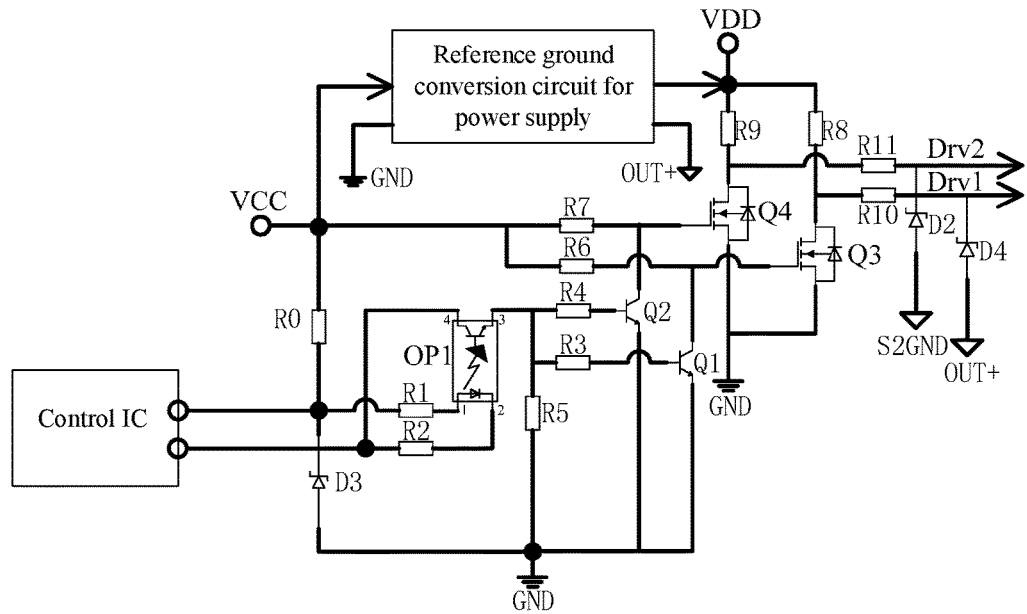
FIG. 3 is the circuit structure diagram 1 for the drive circuit in the embodiment.

The first structure, as shown in FIG. 3, comprises a first drive module and a second drive module;

The control IC, the first drive module and the second drive module are electrically connected in turn, a drive terminal Drv2 of the second drive module is connected to a gate pole of the MOSFET S2, and a drive terminal Drv1 of the second drive module is connected to a gate pole of the MOSFET S1.

Wherein, the first drive module comprises an optocoupler OP1, a voltage regulator tube D3, a resistor R0, a resistor R1 and a resistor R2;

A first signal terminal of the control IC is connected to an input pin 2 of the optocoupler OP1 through the resistor R2 on one hand, and connected to an output pin 4 of the optocoupler OP1 on the other hand. A second signal terminal of the control IC is connected to an input pin 1 of the optocoupler OP1 through the resistor R1 on one hand, grounded through the voltage regulator tube D3 on one hand, and connected to a power supply VCC through the resistor R0 on the other hand.

Wherein, the second drive module comprises a switch Q1, a switch Q2, a switch Q3, a switch Q4, a voltage regulator tube D4, a voltage regulator tube D2 and a plurality of resistors;

An output pin 3 of the optocoupler OP1 is connected to a base of the switch Q1 through the resistor R3 on the one hand, connected to a base of the switch Q2 through the resistor R4 on the one hand, and grounded through the resistor R5 on the other hand;

An emitter of the switch Q1 is grounded, and a collector of the switch Q1 is connected to the gate pole of the switch Q3 on one hand and connected to the power supply VCC through the resistor R6 on the other hand;

An emitter of the switch Q2 is grounded, and a collector of the switch Q2 is connected to the gate pole of the switch Q4 on one hand and connected to the power supply VCC through the resistor R7 on the other hand;

A source electrode of the switch Q3 is grounded, and a drain electrode of the switch Q3 is connected to the power supply VDD through the resistor R8 on one hand and connected to a drive terminal Drv1 through the resistor R10 on the other hand;

A source electrode of the switch Q4 is grounded, and a drain electrode of the switch Q4 is connected to the power supply VDD through the resistor R9 on one hand and connected to a drive terminal Drv2 through the resistor R11 on the other hand;

An anode of the voltage regulator tube D4 is connected to an output terminal OUT+, and a cathode of the voltage regulator tube D4 is connected to the drive terminal Drv1;

An anode of the voltage regulator tube D2 is connected to an reference terminal S2GND, and a cathode of the voltage regulator tube D2 is connected to the drive terminal Drv2.

Figure 5:
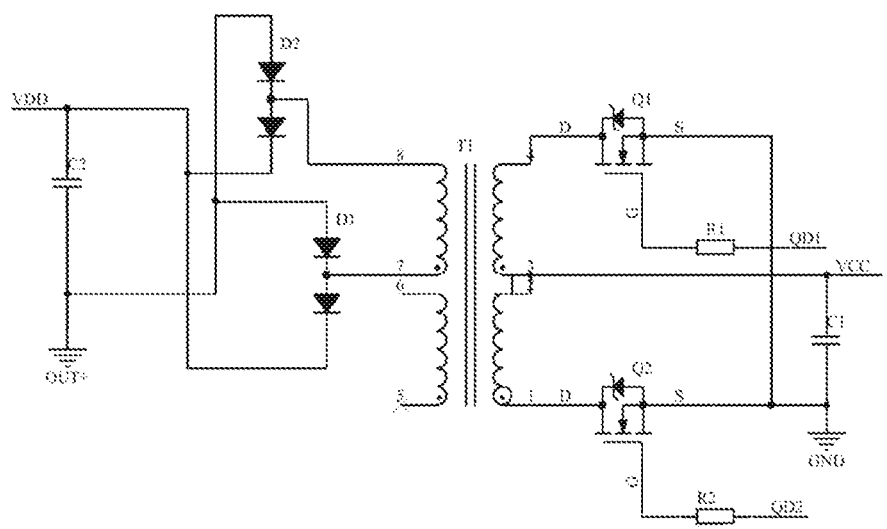
FIG. 5 is the circuit structure diagram for the power supply reference ground in the embodiment.

The power supply VCC in the embodiment is converted by the reference ground conversion circuit for the power supply to obtain the VDD power supply, as shown in FIG. 5. The control IC in the embodiment controls the working state of the conversion circuit through the two pins of QD1 and QD2. The drive circuit for the first structure of the embodiment is composed of switches, optocouplers, voltage regulator tubes, resistors and other electronic components. Only these simple electronic components can realize the safety drive of single-channel signal. The structure is simple, no special suspension power driver chip is required, the cost is low, and the reliability is high.

The drive circuit for the first structure of the embodiment has two working modes: on mode and off mode. The specific workflow is as follows.

On mode: the first signal terminal of the control IC outputs a low level (3.3v), the voltage regulator tube D3 connected to the second signal terminal of the control IC is a 5V voltage regulator tube, and a light-emitting diode is between THE two input pins of the optocoupler OP1. The voltage difference makes the light-emitting diode turned on, so that the output terminal of the optocoupler OP1 is turned on. The output pins 3 and 4 of the optocoupler OP1 keep the same and output high level. At the same time, the switches Q1 and Q2 are turned on, the gate voltages of the switches Q3 and Q4 are reduced to 0V, the switches Q3 and Q4 are turned off, the power supply VDD is respectively connected to the gate poles of MOSFETs S1 and S2 through resistors, MOSFETs S1 and S2 are in on state, the rapid shutdown device outputs and remains in on mode.

Off mode: the first signal terminal of the control IC outputs a low level (0v); the voltage of the input terminal 1 for the optocoupler OP1 stably remains to be 5V, and the voltage difference makes the light-emitting diode turned on, so that the output terminal of the optocoupler OP1 is turned on. The output pins 3 and 4 of the optocoupler OP1 keep the same and output high level. At this time, the switches Q1 and Q2 are turned off, the power supply VCC is respectively connected to the gate poles of switches Q3 and Q4 through resistors, the switches Q3 and Q4 are turned on, the gate voltage of the S1 and S2 are reduced to 0V, MOSFETs S1 and S2 are in off state, the rapid shutdown device does not output and remains in off mode.

The embodiment can effectively solve the problem that the first signal terminal of the control IC cannot be turned off safely when it is short-circuited with the adjacent second signal terminal. When the first signal terminal is short-circuited with the adjacent second signal terminal, the voltages of two input pins for the optocoupler OP1 are the same, there is no voltage difference, and the light-emitting diode between the two input pins cannot be turned on, so that the output terminal of the optocoupler OP1 will be turned off. Whether the output pin 4 of the optocoupler OP1 is in on or off state, the output pin 3 is at low level of 0V. Based on the above working mode analysis, the rapid shutdown device can achieve safe shutoff in off mode.

Figure 4:
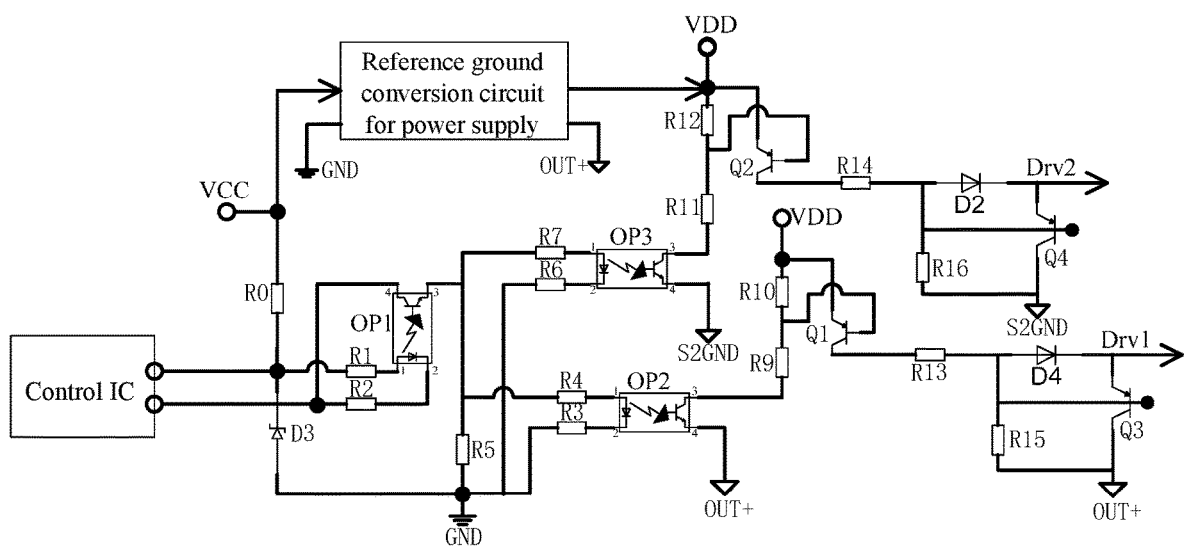
FIG. 4 is the circuit structure diagram 2 for the drive circuit in the embodiment.

The second structure, as shown in FIG. 4, comprises a first drive module and a second drive module; by comparing the second structure with the first structure, the first drive module is the same, and the second drive module is different.

The control IC, the first drive module and the second drive module are electrically connected in turn, a drive terminal Drv2 of the second drive module is connected to a gate pole of the MOSFET S2, and a drive terminal Drv1 of the second drive module is connected to a gate pole of the MOSFET S1.

Wherein, the first drive module comprises an optocoupler OP1, a voltage regulator tube D3, a resistor R0, a resistor R1 and a resistor R2;

A first signal terminal of the control IC is connected to an input pin 2 of the optocoupler OP1 through the resistor R2 on one hand, and connected to an output pin 4 of the optocoupler OP1 on the other hand. A second signal terminal of the control IC is connected to an input pin 1 of the optocoupler OP1 through the resistor R1 on one hand, grounded through the voltage regulator tube D3 on one hand, and connected to a power supply VCC through the resistor R0 on the other hand.

Wherein, the second drive module comprises a switch Q1, a switch Q2, a switch Q3, a switch Q4, an optocoupler OP2, an optocoupler OP3, a diode D4, a diode D2 and a plurality of resistors;

An output pin 3 of the optocoupler OP1 is grounded through the resistor R5 on one hand, connected to an input pin 1 of the optocoupler OP2 through the resistor R4 on one hand and connected to an input pin 1 of the optocoupler OP3 through the resistor R7 on the other hand;

An input pin 2 of the optocoupler OP2 is grounded through the resistor R3, an output pin 4 of the optocoupler OP2 is connected to an output terminal OUT+, an output pin 3 of the optocoupler OP2 is connected to the power supply VDD through resistors R9 and R10 connected in series in turn, a common terminal for connecting the resistors R9 and R10 is connected to a base of the switch Q1, an emitter of the switch Q1 is connected to the power supply VDD, a collector of the switch Q1 is connected to a base of the switch Q3 through the resistor R13, the base of the switch Q3 is connected with a collector of the triode Q3 through the resistor R15 on one hand and connected with an emitter of the triode Q3 through the diode D4 on the other hand, the collector of the triode Q3 is connected to the output terminal OUT+, and an emitter of the triode Q3 is connected to the drive terminal Drv1;

An input pin 2 of the optocoupler OP3 is grounded through the resistor R6, an output pin 4 of the optocoupler OP3 is connected to the reference terminal S2GND, an output pin 3 of the optocoupler OP3 is connected with the power supply VDD through resistors R11 and R12 connected in series in turn, a common terminal for connecting the resistors R11 and R12 is connected to a base of the switch Q2, an emitter of the switch Q2 is connected to the power supply VDD, a collector of the switch Q2 is connected to a base of the switch Q4 through the resistor R14, the base of the switch Q4 is connected with a collector of the triode Q4 through the resistor R16 on one hand and connected with an emitter of the triode Q4 through the diode D2 on the other hand, the collector of the triode Q4 is connected to the reference terminal S2GND, and the emitter of the triode Q4 is connected with the drive terminal Drv2.

The drive circuit for the second structure of the embodiment is also composed of switches, optocouplers, voltage regulator tubes, resistors and other electronic components, which can realize the safety drive of single-channel signal. The structure is simple, the cost is low, and the reliability is high. Wherein, the switch Q1, the switch Q2, the switch Q3 and the switch Q4 are all PNP triodes.

The drive circuit for the second structure of the embodiment has two working modes: on mode and off mode. The specific workflow is as follows.

On mode: the first signal terminal of the control IC outputs a low level (3.3v). The voltage of the input pin 1 for the optocoupler OP1 stably remains to be 5V, and the voltage difference makes the light-emitting diode turned on, so that the output terminal of the optocoupler OP1 will be turned on. The output pins 3 and 4 of the optocoupler OP1 keep the same and output high level. The output terminals of the optocoupler OP2 and the optocoupler OP3 are turned on, the resistor R11 is connected with the reference terminal S2GND, and the resistor R9 is connected with the output terminal OUT+. The base and emitter of the switch Q1 form the turn-on negative voltage, the base and emitter of the switch Q2 form the turn-on negative voltage, the switch Q1 and the switch Q2 are turned on, and the diode D4 and the diode D2 are turned on. The base and emitter of the switch Q3 form the turn-off zero voltage, the base and emitter of the switch Q4 form the turn-off zero voltage. The switch Q3 and the switch Q4 are cut off. The driving voltage of the drive terminal Drv1 is connected to the gate pole of the MOSFET S1, and the driving voltage of the drive terminal Drv2 is connected to the gate pole of the MOSFET S2. MOSFET S1 and MOSFET S2 are in on state, and the rapid shutdown device outputs and works in on mode.

Off mode: the first signal terminal of the control IC outputs a low level (0V). The voltage of the input pin 1 for the optocoupler OP1 stably remains to be 5V, and the voltage difference makes the light-emitting diode turned on, so that the output terminal of the optocoupler OP1 will be turned on. The output pins 3 and 4 of the optocoupler OP1 keep the same and output high level. The input terminals of the optocoupler OP2 and the optocoupler OP3 are cut off, and the output terminals of the optocoupler OP2 and the optocoupler OP3 are cut off. The resistor R11 is disconnected with the reference terminal S2GND, and the resistor R9 is disconnected with the output terminal OUT+. The base and emitter of the switch Q1 form the turn-off zero voltage, and the base and emitter of the switch Q2 form the turn-off zero voltage. The switch Q1 and the switch Q2 are cut off, and the diode D4 and the diode D2 are cut off. The base and emitter of the switch Q3 form the turn-on negative voltage, the base and emitter of the switch Q4 form the turn-on negative voltage. The switch Q3 and the switch Q4 are turned on, the gate poles of MOSFET S1 and MOSFET S2 discharge, MOSFET S1 and MOSFET S2 are in off state, and the rapid shutdown device does not output and works in off mode.

To sum up, the rapid shutdown device of the embodiment has good safety, high reliability and low cost. In light of the special control IC with only single-channel drive signal output, a simple optocoupler is used in the embodiment to ensure that the rapid shutdown device can still enter the shutoff mode to achieve safe shutoff when the signal terminal of the control IC fails and keep high level output. As the single-channel signal can be used for driving two series MOSFETs through safety protection processing, the complexity of the control software will not be increased. As a shutoff switch, the two series MOSFETs can effectively improve system reliability and safety, and have no high voltage output due to damage to a single switch S1 or S2, thereby avoiding personal safety hazards.

Finally, it should be noted that the above embodiments are used only to describe the technical proposal of the invention, but not to limit it. Notwithstanding the detailed description of the invention by reference to the foregoing embodiments, the general technicians in the field should understand that they may modify the technical proposal as recorded in the foregoing embodiments, or make equivalent substitutions for some or all of the technical features. Such modifications or substitutions should not remove the essence of the corresponding technical proposal from the scope of the technical proposal of each embodiment in the invention; instead, it should be covered within the scope of the claims and specification of the invention.

The invention claimed is:

1. A rapid shutdown device capable of driving two MOSFETs connected in series through single drive signal is characterized in that the rapid shutdown device comprises a switch S1, a switch S2, a control IC and a drive circuit;
   a PV+ terminal of the photovoltaic module is connected to an output terminal OUT+ through the switch S1 and the switch S2 connected in series in sequence; a PV− terminal of the photovoltaic module is connected to an output terminal OUT−;
   the control IC, the switch S1 and the switch S2 are connected with the drive circuit respectively, and two signal terminals of the control IC control the on-off of switch S1 and switch S2 through the drive circuit;
   the rapid shutdown device comprises an input capacitor Cin, an output capacitor Cout, a bypass diode D1 and an output resistor Rx;
   the input capacitor Cin is connected to the photovoltaic module in parallel, one end of the output capacitor Cout is connected to the output terminal OUT+, and the other end is connected to the output terminal OUT−, The output capacitor Cout, the bypass diode D1 and the output resistor Rx are connected in parallel;
   the switch S1 is MOSFET S1, and the switch S2 is MOSFET S2;
   the PV+ terminal of the photovoltaic module is connected to a drain electrode of the MOSFET S2, a source electrode of the MOSFET S2 is connected with a drain electrode of the MOSFET S1, and a source electrode of the MOSFET S1 is connected with an output terminal OUT+; a drive terminal Drv2 of the drive circuit is connected to a gate pole of the MOSFET S2, and a drive terminal Drv1 of the drive circuit is connected to a gate pole of the MOSFET S1; and
   a common terminal where the MOSFET S2 and the MOSFET S1 are connected is the reference terminal S2GND.

2. The rapid shutdown device capable of driving two MOSFETs connected in series through single drive signal according to claim 1 is characterized in that the drive circuit comprises a first drive module and a second drive module;
   the control IC, the first drive module and the second drive module are electrically connected in turn, a drive terminal Drv2 of the second drive module is connected to a gate pole of the MOSFET S2, and a drive terminal Drv1 of the second drive module is connected to a gate pole of the MOSFET S1;
   the first drive module comprises an optocoupler OP1, a voltage regulator tube D3, a resistor R0, a resistor R1 and a resistor R2;
   a first signal terminal of the control IC is connected to an input pin 2 of the optocoupler OP1 through the resistor R2 on one hand, and connected to an output pin 4 of the optocoupler OP1 on the other hand, A second signal terminal of the control IC is connected to an input pin 1 of the optocoupler OP1 through the resistor R1 on one hand, grounded through the voltage regulator tube D3 on one hand, and connected to a power supply VCC through the resistor R0 on the other hand.

3. The rapid shutdown device capable of driving two MOSFETs connected in series through single drive signal according to claim 2 is characterized in that the second drive module comprises a switch Q1, a switch Q2, a switch Q3, a switch Q4, a voltage regulator tube D4, a voltage regulator tube D2 and a plurality of resistors;
   an output pin 3 of the optocoupler OP1 is connected to a base of the switch Q1 through the resistor R3 on the one hand, connected to a base of the switch Q2 through the resistor R4 on the one hand, and grounded through the resistor R5 on the other hand;
   an emitter of the switch Q1 is grounded, and a collector of the switch Q1 is connected to the gate pole of the switch Q3 on one hand and connected to the power supply VCC through the resistor R6 on the other hand;
   an emitter of the switch Q2 is grounded, and a collector of the switch Q2 is connected to the gate pole of the switch Q4 on one hand and connected to the power supply VCC through the resistor R7 on the other hand;
   a source electrode of the switch Q3 is grounded, and a drain electrode of the switch Q3 is connected to the power supply VDD through the resistors R8 on one hand and connected to a drive terminal Drv1 through the resistor R10 on the other hand;
   a source electrode of the switch Q4 is grounded, and a drain electrode of the switch Q4 is connected to the power supply VDD through the resistor R9 on one hand and connected to a drive terminal Drv2 through the resistor R11 on the other hand;
   an anode of the voltage regulator tube D4 is connected to an output terminal OUT+, and a cathode of the voltage regulator tube D4 is connected to a drive terminal Drv1; and
   an anode of the voltage regulator tube D2 is connected to a reference terminal S2GND, and a cathode of the voltage regulator tube D2 is connected to the drive terminal Drv2.

4. The rapid shutdown device capable of driving two MOSFETs connected in series through single drive signal according to claim 2 is characterized in that the second drive module comprises a switch Q1, a switch Q2, a switch Q3, a switch Q4, an optocoupler OP2, an optocoupler OP3, a diode D4, a diode D2 and a plurality of resistors;

an output pin 3 of the optocoupler OP1 is grounded through the resistor R5 on one hand, connected to an input pin 1 of the optocoupler OP2 through the resistor R4 on one hand and connected to an input pin 1 of the optocoupler OP3 through the resistor R7 on the other hand;

an input pin 2 of the optocoupler OP2 is grounded through the resistor R3, an output pin 4 of the optocoupler OP2 is connected to an output terminal OUT+, an output pin 3 of the optocoupler OP2 is connected to the power supply VDD through resistors R9 and R10 connected in series in turn, a common terminal for connecting the resistors R9 and R10 is connected to a base of the switch Q1, an emitter of the switch Q1 is connected to the power supply VDD, a collector of the switch Q1 is connected to a base of the switch Q3 through the resistor R13, the base of the switch Q3 is connected with a collector of a triode Q3 through the resistor R15 on one hand and connected with an emitter of the triode Q3 through the diode D4 on the other hand, the collector of the triode Q3 is connected to the output terminal OUT+, and an emitter of the triode D3 Q3 is connected to the drive terminal Drv1;

an input pin 2 of the optocoupler OP3 is grounded through the resistor R6, an output pin 4 of the optocoupler OP3 is connected to the reference terminal S2GND, an output pin 3 of the optocoupler OP3 is connected with the power supply VDD through resistors R11 and R12 connected in series in turn, a common terminal for connecting the resistors R11 and R12 is connected to a base of the switch Q2, an emitter of the switch Q2 is connected to the power supply VDD, a collector of the switch Q2 is connected to a base of the switch Q4 through the resistor R14, the base of the switch Q4 is connected with a collector of a triode Q4 through the resistor R16 on one hand and connected with an emitter of the triode Q4 through the diode D2 on the other hand, the collector of the triode Q4 is connected to the reference terminal S2GND, and the emitter of the triode Q4 is connected with the drive terminal Drv2.

5. The rapid shutdown device capable of driving two MOSFETs connected in series through single drive signal according to claim 1 is characterized in that the drive circuit comprises a first drive module and a second drive module.

* * * * *